United States Patent
Ali

(10) Patent No.: US 8,604,953 B2
(45) Date of Patent: Dec. 10, 2013

(54) CALIBRATING TIMING, GAIN AND BANDWIDTH MISMATCH IN INTERLEAVED ADCS

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/596,626

(22) Filed: Aug. 28, 2012

(65) Prior Publication Data

US 2013/0120175 A1    May 16, 2013

Related U.S. Application Data

(60) Provisional application No. 61/559,335, filed on Nov. 14, 2011.

(51) Int. Cl.
*H03M 1/10* (2006.01)

(52) U.S. Cl.
USPC .......................................... 341/120; 341/155

(58) Field of Classification Search
USPC ............................ 341/120, 118, 155, 161, 144
See application file for complete search history.

(56) References Cited

U.S. PATENT DOCUMENTS

| | | | |
|---|---|---|---|
| 6,208,414 B1 | 3/2001 | Killpatrick et al. | |
| 7,187,310 B2 * | 3/2007 | El-Sankary et al. | 341/120 |
| 7,233,274 B1 | 6/2007 | Kuhn | |
| 7,786,910 B2 * | 8/2010 | Ali et al. | 341/131 |
| 7,924,204 B2 * | 4/2011 | Chang et al. | 341/161 |
| 8,068,045 B2 | 11/2011 | Ali et al. | |
| 8,144,040 B2 * | 3/2012 | Messier et al. | 341/118 |
| 2002/0121993 A1 | 9/2002 | Velazquez | |
| 2009/0258612 A1 | 10/2009 | Zhuang et al. | |
| 2010/0039302 A1 | 2/2010 | Ali et al. | |
| 2010/0220514 A1 | 9/2010 | Vigoda et al. | |

OTHER PUBLICATIONS

PCT International Search Report and Written Opinion from PCT/US2012/054445, mailed on Nov. 15, 2012.
Yoo et al., "A 2.5-V 10-b 120-MSample/s CMOS Pipelined ADC Based on Merged-Capacitor Switching", IEEE Transactions on Circuits and Systems-II: Express Briefs, vol. 51, No. 5, May 2004.

\* cited by examiner

*Primary Examiner* — Peguy Jean Pierre
(74) *Attorney, Agent, or Firm* — Kenyon & Kenyon LLP

(57) ABSTRACT

A method and a corresponding device for calibrating an interleaved analog-to-digital converter (ADC) involve injecting a randomly determined amount of dither into at least one of a flash component and a multiplying digital-to-analog converter (MDAC) in a selected channel in the ADC. A correlation procedure is performed to estimate, based on an overall ADC output, a gain experienced by the injected dither after propagating through the channel. The injection and the correlation procedure are repeated on at least one additional channel to estimate a gain for each at least one additional channel. The estimated gains of the selected channel and the at least one additional channel are then compared to determine a degree of mismatch between the selected channel and each at least one additional channel. At least one channel is calibrated as a function of the determined degree of mismatch.

24 Claims, 5 Drawing Sheets

CALIBRATING TIMING, GAIN AND BANDWIDTH MISMATCH IN INTERLEAVED ADCS

CROSS-REFERENCE TO RELATED APPLICATIONS

This application claims the benefit, under 35 U.S.C. §119 (e), of U.S. Provisional Patent Application No. 61/559,335, filed Nov. 14, 2011, the contents of which is hereby incorporated by reference in its entirety.

BACKGROUND INFORMATION

In an interleaved analog-to-digital converter (ADC), a plurality of converting stages are connected in parallel to an analog input signal. The timing of when the stages are activated is controlled by a clock input to each stage. Typically, the stages are controlled using at least two clock inputs that have different timing. In this manner, the stages are able to process different time slices of the same input signal. The digital outputs of each stage are then combined to form an overall output of the ADC that represents a digital approximation of the input to the ADC. FIG. 1 shows a block diagram of a conventional interleaved ADC. Three stages 100/110/120 are connected in parallel to an input Vin. Each stage forms an interleaved channel. For illustration purposes, only the first two channels and the final (Nth) channel are shown. However, the interleaved ADC may have any number of channels. The first stage 100 may include an ADC 10 (also known as a "flash") and a multiplying digital-to-analog converter (MDAC) 50. The MDAC 50 includes a digital-to-analog converter (DAC) 20 and an amplifier 30. Vin is input to the ADC 10 to generate a digital input to the DAC 20, which in turn converts the digital output of the ADC 10 back into an analog signal. The analog output of the DAC 20 is then subtracted from Vin and the result input to the amplifier 30 to generate an analog output voltage VO1, which can be used as input to the next stage if the channel is a pipelined channel (not shown). Pipelining, however, is optional and in another embodiment, stage 100 may directly generate a digital output without need for an MDAC, since no other stages would be connected to stage 100. The stages 100/110/120 may include similar components and as with the stage 100, the stages 110 and 120 may also be pipelined. Each stage 100/110/120 is controlled by a respective clock input (Clock1, Clock2 and Clock3) to form an interleaved channel that is operated in parallel with the other channels of the ADC.

The timing configuration of the clock inputs can vary. For instance Clock1 and Clock2 may be phase offset, then the next stage after Stage2 (not shown) may be connected to a clock that is in-phase with Clock1, so that the phases of the clocks alternate in successive fashion. In another embodiment, each of the clocks may operate on different phases. Other configurations are also possible.

Interleaved ADCs are advantageous because by processing different portions of the input in parallel, the effective sampling rate of the ADC is increased without having to apply a faster clock input. However, interleaved ADCs are sensitive to timing issues such as mismatches between the relative timing of the different stages (known as timing or phase mismatch). When stages do not operate at the right times, and in particular when the stages of one channel are time mismatched relative to the stages of another channel, the resulting ADC output will be inaccurate.

Other types of mismatches affecting the accuracy of an interleaved ADC include gain mismatch and bandwidth mismatch, which are related in that bandwidth mismatch produces gain mismatch as well as timing mismatch. Bandwidth mismatch arises due to the fact that each stage is an RC circuit in which the resistive component R corresponds to the resistances of the switches that operate to switch between sample and hold phases of operation, and the capacitive component C corresponds to the sampling capacitors that are used to sample the input applied to the stage. Thus, each stage has an RC time constant that influences the delay that the input experiences as it is processed by the stage and the output of the stage is dependent on this time constant. Bandwidth mismatch occurs when the time constant of an interleaved stage deviates from the time constant of the other interleaved stages, so that the gain experienced by the input in that stage deviates from the other stages' gains. Bandwidth mismatch results in both gain and phase mismatch, because the bandwidth affects both the amplitude and the phase of the sampled signal. The timing of when the signal is sampled or held in that stage may also change as a result of bandwidth mismatch. The extent of the bandwidth mismatch is dependent on the frequency of the input and is generally worse at high frequencies than at low frequencies.

SUMMARY

Example embodiments of the present invention provide for a reduction in timing, gain and bandwidth mismatch in interleaved ADCs. In an example embodiment, a random or pseudorandom dither is injected into a selected channel in an interleaved ADC and a correlation algorithm is applied to estimate, based on the overall ADC output, the gain experienced by the injected dither as it propagated through the channel. The dither injection and gain estimation is repeated for a plurality of channels and the gain estimates are compared to determine whether the channels are mismatched relative to each other. If it is determined that the channels are mismatched, at least one of the channels is adjusted using analog and/or digital techniques in order to reduce the mismatch.

DETAILED DESCRIPTION OF EXAMPLE EMBODIMENTS

Figure 1:
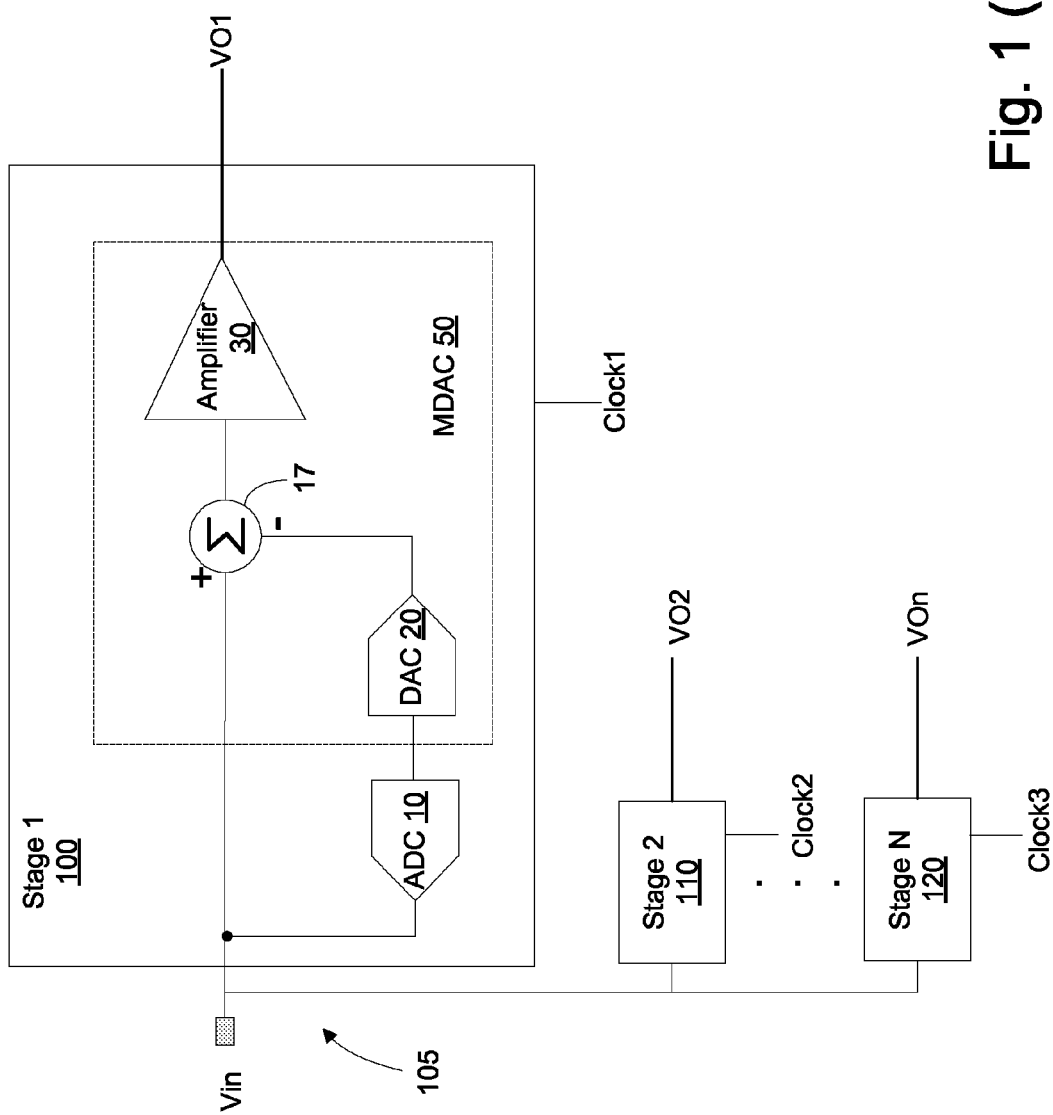
FIG. 1 shows a block diagram of a conventional interleaved ADC.
Figure 2:
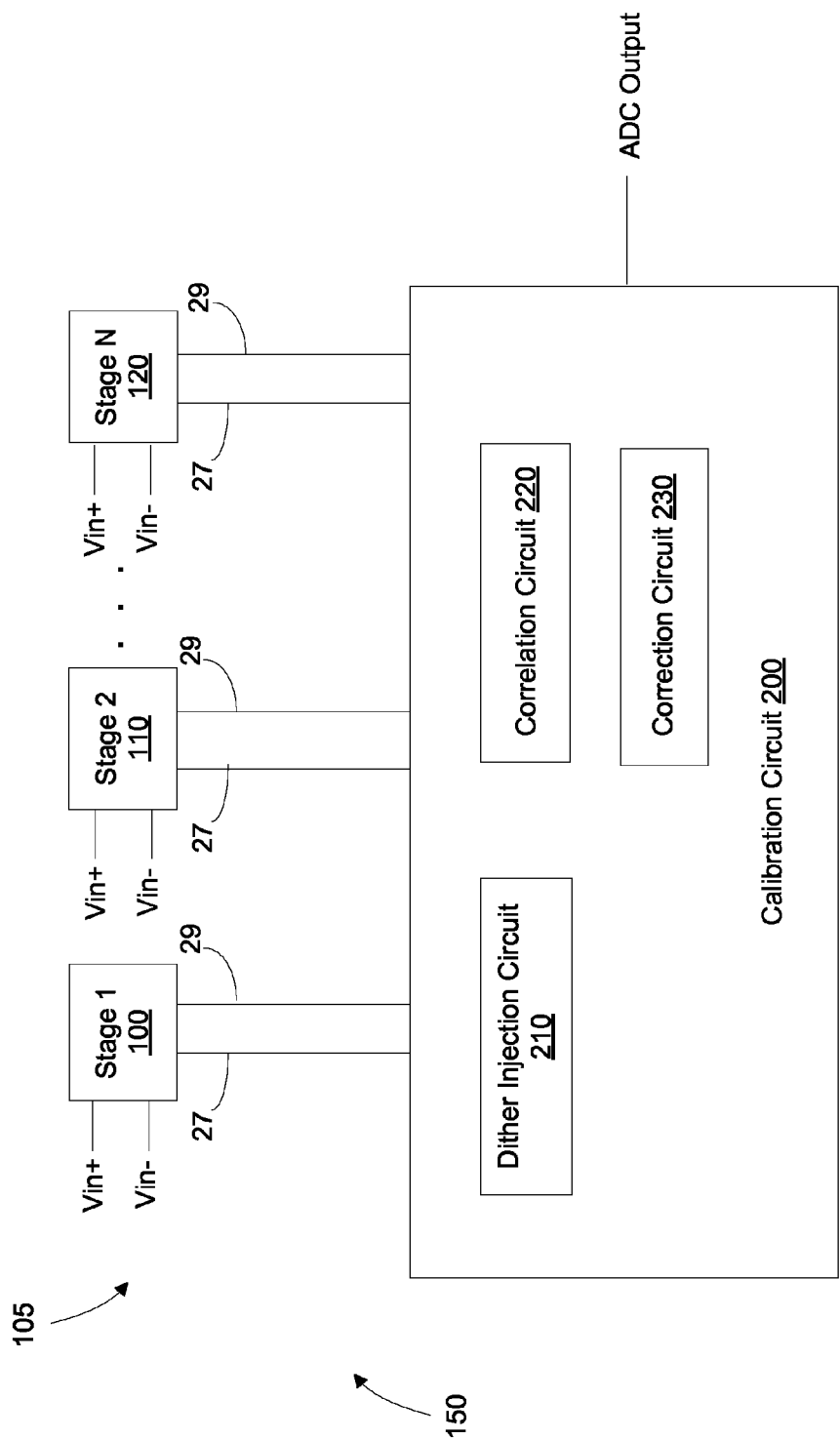
FIG. 2 shows an exemplary system for calibrating timing, gain and bandwidth mismatch according to the present invention.

FIG. 2 shows an exemplary system 150 according to the present invention. The system 150 may include a plurality of interleaved channels, which begin with stages 100/110/120 as described above, in addition to a calibration circuit 200. The calibration circuit 200 may include a dither injection circuit 210, a correlation circuit 220, and a correction circuit 230. Each channel is shown connected to a pair of differential inputs Vin+ and Vin−. It will be understood that the exemplary circuits and methods described herein may be used in conjunction with the hardware associated with either of these inputs.

Figure 3A:
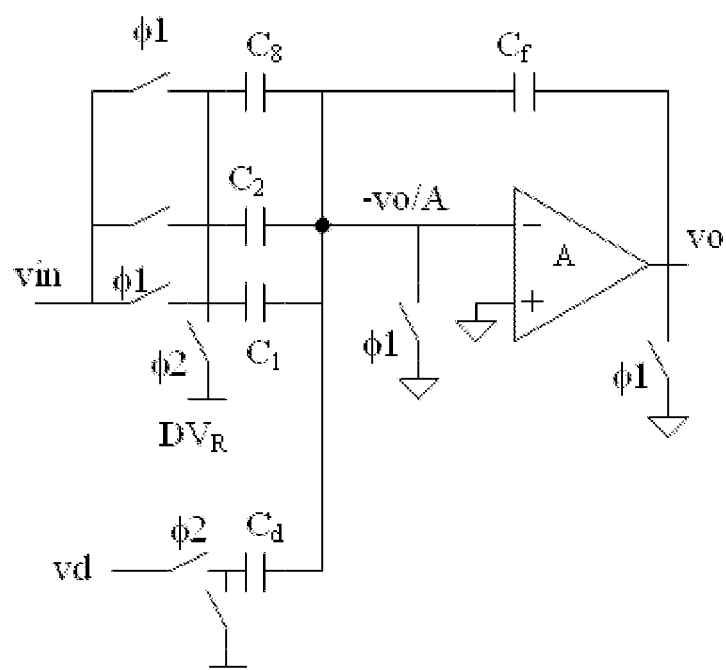
FIG. 3a shows an exemplary dither injection circuit suitable for use with a calibration method of the present invention.
Figure 3B:
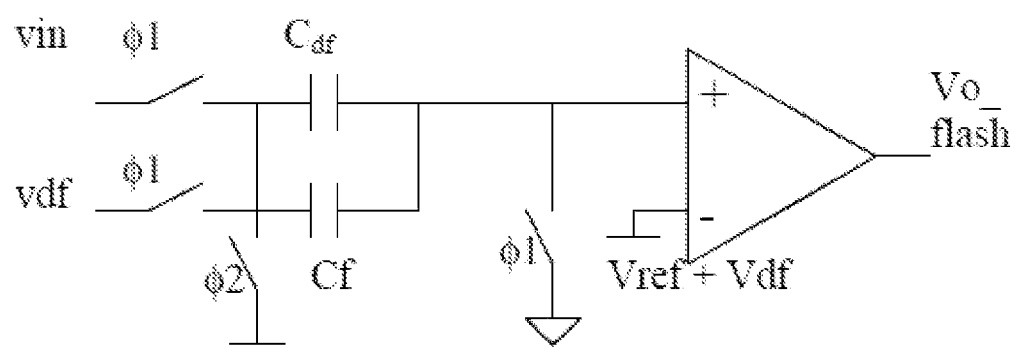
FIG. 3b shows another exemplary dither injection circuit suitable for use with a calibration method of the present invention.

The dither injection circuit 210 may include a circuit arrangement for generating and injecting dither into the MDAC or flash of at least one stage in each channel. Preferably, the dither is injected into at least the first stage of each channel (e.g., stages 100/110/120) through a connection 27, but other injection points are also possible when the channels are pipelined. Thus, the dither can be injected into other stages in any particular pipeline, for example, the first two or three stages nearest the input. The dither may be generated as a random or pseudo-random voltage and applied to a suitable injection point in each stage (e.g., the flash and/or MDAC). Any method of generating and applying a predetermined voltage may be used for providing the dither. For example, a pseudo-random digital number may be used for generating the dither voltage using a switched capacitor network in which the dither is injected via one or more capacitors connected in parallel with sampling capacitors in each stage (e.g., in sampling capacitors located in DAC 20). Examples of dither injection circuits suitable for use with the present invention are shown in FIGS. 3a and 3b, discussed below.

The calibration circuit 200 may include a correlation circuit 220 for processing the digital output of each interleaved channel. In FIG. 2, the channels are not pipelined, so the digital output of each channel is obtained directly from the first stage of each channel through connections 29, each of which connects to the output of a separate channel. However, it will be understood that when the channels are pipelined, the channel outputs may be obtained by appropriately combining the outputs of each stage in a given channel, e.g., using a constructor circuit, which may be located outside the circuit 200 or, alternatively located as a sub-component within the circuit 200. The constructor circuit may also combine the channel outputs to form the overall ADC output. In a pipelined embodiment, the calibration circuit 200 may include connections for injecting dither and receiving digital output from a plurality of stages in the pipeline.

The correlation circuit 220 may receive the overall ADC output and correlate the dither to the overall ADC output. Correlation may be performed using any statistical correlation technique. In one embodiment, the correlation technique used is least mean squares (LMS). Applying an LMS algorithm, the correlation circuit 220 may digitally separate (decorrelate) the dither and the input Vin to obtain an estimate of the gain that the dither experienced after propagating through a given channel. The gain estimate is based on a "kick-back" effect that occurs when the sampling capacitors in a stage are reconnected to the input, so that residual charge stored on the capacitors is superimposed onto the value of the input signal. The kick-back effect and correlation based methods for reducing kick-back are described in U.S. patent application Ser. No. 13/314,451 filed Dec. 8, 2011 ("the '451 application," the content of which is hereby incorporated by reference in its entirety).

Because the injected dither will kick-back the input in a manner similar to that of the DAC capacitances, the dither experiences the same bandwidth, gain and timing as the input signal. Therefore, the dither gain depends on the input bandwidth in a manner similar to the input signal. The dither gain is estimated as an LMS coefficient (referred to herein as a gain coefficient GC). The gain estimate, which represents the effect of the timing, gain and/or bandwidth of the input network, is then used as a measure of the channel mismatch.

Using this estimate, correction can be employed in the digital domain or the error can be fed back to the analog domain to correct for the mismatch.

The following LMS algorithm is exemplary:

$$Gc_{n+1}(k,k-1) = Gc_n(k,k-1) - \mu * Vd_{k-1} * [Vd_{k-1} * Gc_n(k,k-1) - Vin_k] \qquad (1)$$

Gc(k, k−1) is the gain coefficient corresponding to the kick-back contributed by sample k−1 (i.e., the previous sample) onto sample k, $Vd_{k-1}$ is the dither injected in the previous sample and $Vin_k$ is the current digital output of the ADC (i.e., the digital approximation of the analog input to the ADC, generated by appropriately combining the individual digital outputs of each interleaved channel). Vd is the dither injected in the previous sample. The Vd corresponding to the previous sample is used because the kick-back effect appears on the next sample and not the current sample.

Dither injection in accordance with the example embodiments of the present invention may occur in the MDAC, the flash or both the MDAC and the flash simultaneously. Therefore, any number of known injection circuits may be suitable for use with the present invention, including the circuits shown in FIGS. 3a and 3b.

In FIG. 3a, the dither is injected in the MDAC using a capacitance Cd (which may be formed using one or more smaller capacitors). The capacitance Cd is switchably connected between a dither voltage Vd and ground. Cd is in parallel with a set of DAC capacitors C1, C2 . . . C8, which are switchably connected between a Vin signal that charges the capacitors and a digital reference signal $DV_R$ that is the digital output of the flash component in the stage.

FIG. 3b is a combination of two injection methods described in the '451 application. In FIG. 3b, the dither is injected as a voltage reference (Vref+Vdf) to a comparator in the flash. The dither is also shown as a voltage Vdf injected in parallel with the input Vin. These are alternative methods for injection into the flash, but for illustration purposes are shown together in the same circuit in FIG. 3b. As mentioned earlier, dither injection may occur in the flash and the MDAC simultaneously. Accordingly, the circuits of FIGS. 3a and 3b may both be used in one embodiment of a calibration circuit.

The correction circuit 230 may perform the analog and/or digital correction based on the estimated gains. Digital correction may be performed by adjusting the digital output of one channel so that the gain/timing/bandwidth characteristics of the channel match the characteristics of another channel. The channels need not be exactly matched as long as the mismatch remaining after correction is small enough that the overall ADC output is reasonably accurate. A multiplier coefficient may be applied to the channel output (i.e., the combined digital outputs from each stage in a particular channel). To obtain the digital correction, the multiplier associated with the stage in which the dither was injected may be modified to cancel the deviation between the GC values of two or more channels in which dither was injected. For example, if the GC of channel 1 is smaller than the GC of channel 2, the multiplier of channel 1 can be increased while keeping the multiplier of channel 2 the same. Alternatively, the multiplier of channel 2 may be decreased while keeping the multiplier of channel 1 the same or increasing the multiplier of channel 1 only slightly.

Analog correction may involve iteratively changing circuit parameters of one or more stages in the channel being adjusted until the mismatch between both channels is determined by the correction circuit 320 to be sufficiently reduced. For example, the timing of the clock input to channel 1 may be phase-shifted to the left or right until the GC of channel 1 matches the GC of channel 2. The direction of the shift depends on the polarity of the error, e.g., the sign of the difference between the GC of channel 1 and the GC of channel 2. For example, a left shift may be used to increase the GC of channel 1 in response to a negative error, since a negative sign indicates that the channel 1 GC is smaller than the channel 2 GC. The correction may be performed each time a new GC difference is calculated and correction may be terminated when the GC difference is below some predefined threshold value.

Alternatively, timing adjustment can be done by changing the voltage level of the sampling clock or of the DC voltage bias of the sampling switch located in the MDAC. The sampling instant is defined as the time when the gate-to-source voltage (Vgs) of the transistor device that forms the sampling switch falls below the threshold value of the device. If the gate voltage (which is the sampling clock level) or the source voltage (which is set by the DC bias of the sampling switch) is adjusted, the sampling instant will change.

Other circuit parameters may be used for analog correction, including the RC components in one or more stages in the channel being adjusted. For example, the resistances of the switches in a selected stage may be adjusted by including an adjustable resistor in series with the switches or by making the resistances of the switches themselves adjustable. As an alternative to adjusting resistance, the sampling capacitors may be adjustable and their capacitance values adjusted to alter the RC time constant of the stage until the GC difference is minimized (if the GC of channel 1 is larger, this means there was less signal decay and therefore channel 1 has a larger RC time constant, which could then be reduced by, e.g., lowering the resistances or capacitances in one or more selected stages of channel 1).

An exemplary method for calibrating timing, gain and bandwidth mismatch will now be described. The method may be performed on the exemplary system described above. It may be difficult to determine, using the dither injection described above, which type of error (fixed gain error, gain error caused by bandwidth mismatch, or timing error) is causing the GC difference. However, if the sampling rate changes, the timing error tends to change more than the gain error, so one method for determining how much of the GC difference is attributed to timing error is to change the sampling rate and monitor the effect on the GC difference value of changing sampling rates. Another possible method for determining how much of the GC difference is attributed to timing error is by performing each type of adjustment (gain and timing) separately and then observing the rate of change between the current GC difference and the next GC difference that is calculated. If the mismatch is caused by timing error, changing the timing will have much more of an impact on the GC difference than changing the gain, and vice versa. Therefore, it may be possible to differentiate between the gain and timing errors by identifying the parameter that has the most impact, and focusing on changing that parameter. However, these methods may be complicated to implement and may not always reliably distinguish between error types. Accordingly, in one embodiment, it may be sufficient for calibration purposes to avoid determining the error type, and instead to only perform one type of adjustment (either a gain adjustment or a timing adjustment) in response to each instance of determined mismatch. Preferably, gain is adjusted until it is determined that changing the gain no longer has any reducing effect on the GC difference. At that point, timing adjustment may be introduced.

The exemplary method may also be used in combination with other calibration techniques. For example, it may be possible to use a different technique to calibrate gain mismatches, in which case the exemplary method may be used only for timing mismatch calibration. Combining the exemplary method with another calibration technique may be particularly beneficial when no attempt is made at distinguishing error type.

Figure 4:
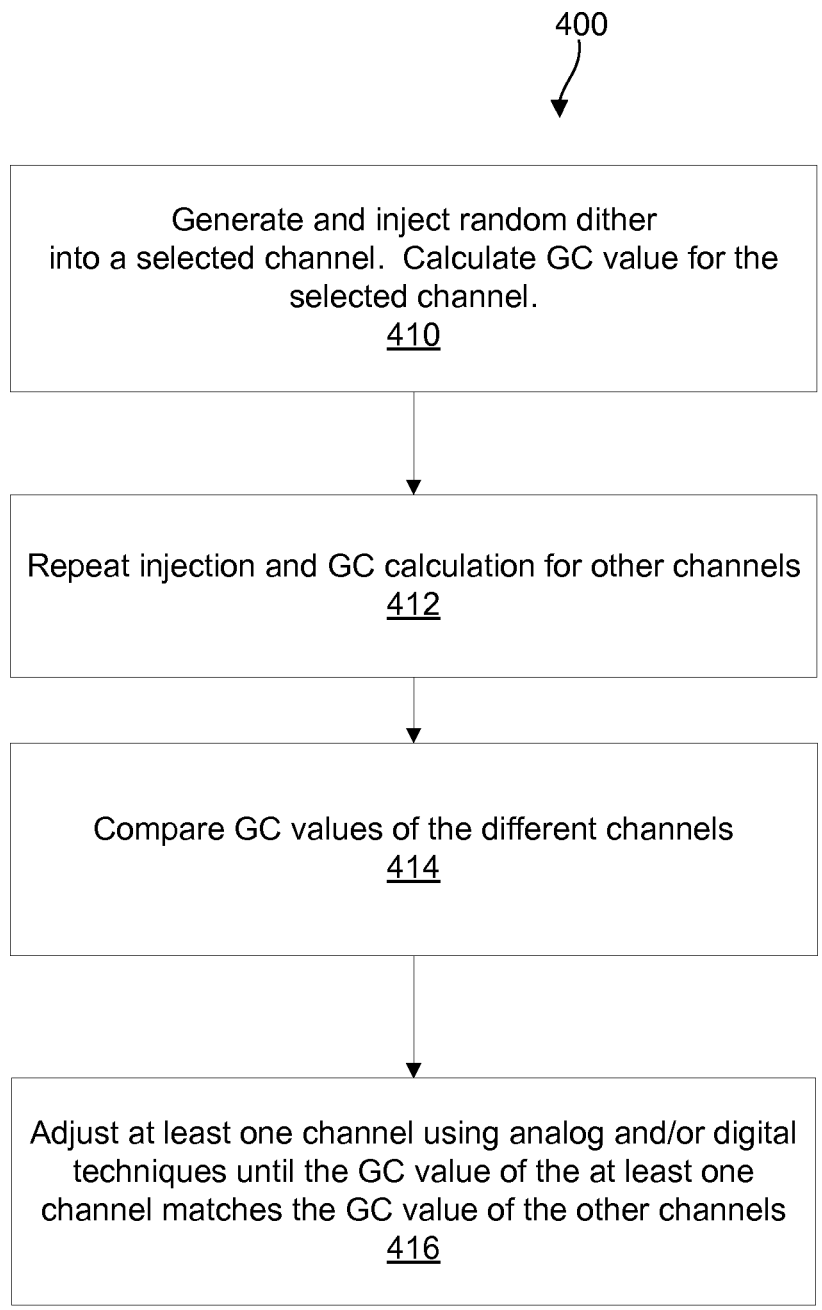
FIG. 4 shows an exemplary method for calibrating timing, gain and bandwidth mismatch according to the present invention.

FIG. 4 is an exemplary method 400 for calibrating timing, gain and bandwidth mismatch in interleaved ADCs according to the present invention. The method 400 may begin at step 410, where the dither, which is a random or pseudo-random voltage value, is generated and injected into a selected channel and a GC value is calculated for the selected channel from the overall ADC output and using an LMS algorithm or any other correlation algorithm.

At 412, the dither injection and GC calculation from step 410 is repeated for other channels. The same dither signal that was injected into the first channel in step 410 may be injected into the other channels. However, this is not necessary since the GC value of each channel may be calculated from any known dither that's injected into the channel.

At 414, the GC values of the channels are compared by, for example, calculating differences between the GC value of one channel and the GC values of the remaining channels.

At 416, at least one of the channels is adjusted by applying analog and/or digital techniques to perform a gain or a timing adjustment in one or more stages in the channel so that the next GC value calculated for that channel (i.e., calculated from the overall ADC output associated with the next dither injection) matches the next GC value of the other channels. As discussed earlier, adjustment may occur in at least the first stage of the channel, but may also occur in a plurality of stages in the channel. In some instances, the GC values may indicate that more than one channel needs to be adjusted, i.e., a plurality of channels are mismatched relative to the remaining channels. In this situation, the calibration circuit may determine a target GC value for all the channels and then adjust only the mismatched channels (e.g., those channels that have GC values which exceed the target GC value by a certain threshold) towards the target. In one embodiment, the target may be a median or average of the GC values for all the channels.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense.

What is claimed is:

1. A method for calibrating an interleaved analog-to-digital converter (ADC), comprising:
   injecting a randomly determined amount of dither into at least one of a flash component and a multiplying digital-to-analog converter (MDAC) in a selected channel in the ADC;
   performing a correlation procedure to estimate, based on an overall ADC output, a gain experienced by the injected dither after propagating through the channel;
   repeating the injecting and the correlation procedure on at least one additional channel to estimate a gain for each at least one additional channel;
   comparing the estimated gains of the selected channel and the at least one additional channel to determine a degree of mismatch between the selected channel and each at least one additional channel; and calibrating at least one channel as a function of the determined degree of mismatch.

2. The method of claim 1, wherein the calibrating includes at least one of an analog and a digital adjustment to the at least one channel.

3. The method of claim 2, further comprising:
determining the degree of mismatch by calculating a difference between the gain estimate of the selected channel and the gain estimate of each at least one additional channel.

4. The method of claim 2, further comprising:
performing the adjustment by phase-shifting a clock input of the at least one channel.

5. The method of claim 2, further comprising:
performing the adjustment by changing an RC time constant of a stage in the at least one channel.

6. The method of claim 5, wherein the RC time constant is changed by adjusting a capacitance in the at least one channel.

7. The method of claim 5, wherein the RC time constant is changed by adjusting a resistance in the at least one channel.

8. The method of claim 2, further comprising:
performing the adjustment by changing a value of a multiplier applied to an output of the least one channel.

9. The method of claim 1, wherein the dither is injected into both the flash component and the MDAC component simultaneously.

10. The method of claim 1, further comprising:
repeating the injection, the correlation and the calibration until it is determined that the degree of mismatch is below a specified threshold.

11. The method of claim 1, further comprising:
identifying the mismatch as being one of a gain mismatch and a timing mismatch by changing a sampling rate of the ADC and monitoring of the effect of changing the sampling rate on the degree of mismatch.

12. The method of claim 1, further comprising:
identifying the mismatch as being one of a gain mismatch and a timing mismatch by performing a gain adjustment separately from a timing adjustment and determining which adjustment had a greater impact on the degree of mismatch.

13. A device for calibrating an interleaved analog-to-digital converter (ADC), comprising:
an injection arrangement configured to inject a randomly determined amount of dither into at least one of a flash component and a multiplying digital-to-analog converter (MDAC) in a selected channel in the ADC;
a correlation arrangement configured to perform a correlation procedure to estimate, based on an overall ADC output, a gain experienced by the injected dither after propagating through the channel;
wherein the injection arrangement and the correlation arrangement repeat the injecting and the correlation procedure on at least one additional channel to estimate a gain for each at least one additional channel; and
a correction arrangement configured to:
compare the estimated gains of the selected channel and the at least one additional channel to determine a degree of mismatch between the selected channel and each at least one additional channel; and
calibrate at least one channel as a function of the determined degree of mismatch.

14. The device of claim 13, wherein the calibrating includes at least one of an analog and a digital adjustment to the at least one channel.

15. The device of claim 14, wherein the correction arrangement determines the degree of mismatch by calculating a difference between the gain estimate of the selected channel and the gain estimate of each at least one additional channel.

16. The device of claim 14, wherein the correction arrangement performs the adjustment by phase-shifting a clock input of the at least one channel.

17. The device of claim 14, wherein the correction arrangement performs the adjustment changing an RC time constant of a stage in the at least one channel.

18. The device of claim 17, wherein the RC time constant is changed by adjusting a capacitance in the at least one channel.

19. The device of claim 17, wherein the RC time constant is changed by adjusting a resistance in the at least one channel.

20. The device of claim 14, wherein the correction arrangement performs the adjustment by changing a value of a multiplier applied to an output of the least one channel.

21. The device of claim 13, wherein the dither is injected into both the flash component and the MDAC component simultaneously.

22. The device of claim 13, wherein the device is configured to repeat the injection, the correlation and the calibration until it is determined that the degree of mismatch is below a specified threshold.

23. The device of claim 13, wherein the device is configured to:
identify the mismatch as being one of a gain mismatch and a timing mismatch by changing a sampling rate of the ADC and monitoring of the effect of changing the sampling rate on the degree of mismatch.

24. The method of claim 13, wherein the device is configured to:
identify the mismatch as being one of a gain mismatch and a timing mismatch by performing a gain adjustment separately from a timing adjustment and determining which adjustment had a greater impact on the degree of mismatch.

* * * * *